US009249356B2

(12) United States Patent
Van Oosten et al.

(10) Patent No.: US 9,249,356 B2
(45) Date of Patent: Feb. 2, 2016

(54) LIQUID CRYSTAL DYE MIXTURE

(75) Inventors: Casper Laurens Van Oosten, Utrecht (NL); Albertus Petrus Hendrikus Johannes Schenning, Bladel (NL)

(73) Assignee: PEER+ B.V., Eindhoven (NL)

( * ) Notice: Subject to any disclaimer, the term of this patent is extended or adjusted under 35 U.S.C. 154(b) by 104 days.

(21) Appl. No.: 14/131,109

(22) PCT Filed: Jul. 3, 2012

(86) PCT No.: PCT/EP2012/062868
§ 371 (c)(1),
(2), (4) Date: Jan. 6, 2014

(87) PCT Pub. No.: WO2013/004677
PCT Pub. Date: Jan. 10, 2013

(65) Prior Publication Data
US 2014/0138579 A1 May 22, 2014

(30) Foreign Application Priority Data

Jul. 5, 2011 (EP) .................................... 11172744

(51) Int. Cl.
*C09K 19/60* (2006.01)
*H01L 31/055* (2014.01)
(52) U.S. Cl.
CPC ............... *C09K 19/606* (2013.01); *C09K 19/60* (2013.01); *H01L 31/055* (2013.01)
(58) Field of Classification Search
CPC ..... C09K 19/60; C09K 19/606; H01L 31/055
See application file for complete search history.

(56) References Cited

U.S. PATENT DOCUMENTS

| | | | |
|---|---|---|---|
| 3,833,287 A | 9/1974 | Taylor et al. | |
| 4,378,302 A | 3/1983 | Aftergut et al. | |
| 6,541,645 B1 * | 4/2003 | Canary et al. | 549/5 |
| 7,024,068 B2 * | 4/2006 | Canary et al. | 385/15 |
| 8,501,948 B2 | 8/2013 | Konemann | |
| 2007/0273265 A1 | 11/2007 | Hikmet | |

FOREIGN PATENT DOCUMENTS

| | | |
|---|---|---|
| CN | 101263203 A | 9/2008 |
| DE | 10 2005 037 115 A1 | 2/2007 |

(Continued)

OTHER PUBLICATIONS

Chen et al.; "Synthesis and Characterization of Fluorescent Acenequinones as Dyes for Guest-Host Liquid Crystal Displays;" *Org. Lett.*; pp. 997-1000; 2007; vol. 9, No. 6.

(Continued)

*Primary Examiner* — Shean C Wu
(74) *Attorney, Agent, or Firm* — Oliff PLC

(57) ABSTRACT

A guest-host liquid crystal dye mixture comprising a calamatic, thermotropic liquid crystal as host and a dichroic fluorescent dye as guest, characterized in that the dichroic fluorescent dye is a multichromophoric dye containing at least a group with the general formula Ry-$X_1$—$C_1$, wherein Ry is a chromophore from the rylene family, $C_1$ is a second chromophore and $X_1$ is a spacer that interrupts the conjugation between Ry and $C_1$, the spacer $X_1$ is selected such that it introduces rigidity against bending or folding over an axis perpendicular to the length of the molecule.

7 Claims, 12 Drawing Sheets

Configuration with the second chromophores being arranged along the primary absorption axis of the first (rylene) chromophore (a) and a possible behavior (b) for light hitting the guest host mixture parallel or perpendicular to its alignment.

(56) References Cited

FOREIGN PATENT DOCUMENTS

| JP | A-6-318766 | 11/1994 |
| WO | WO 00/52099 A1 | 9/2000 |
| WO | WO 2009/141295 A1 | 11/2009 |

OTHER PUBLICATIONS

Bahadur; "Dichroic Liquid Crystal Displays;" *Liquid Crystals: Applications and Uses*; pp. 68-199; 1992; vol. 3.

Iwanaga; "Development of Highly Soluble Anthraquinone Dichroic Dyes and Their Application to Three-Layer Guest-Host Liquid Crystal Displays;" *Materials*; 2009; pp. 1636-1661; vol. 2.

Zhang et al.; "Highly dichroic benzo-2,1,3-thiadiazole dyes containing five linearly π-conjugated aromatic residues, with fluorescent emission ranging from green to red, in a liquid crystal guest-host system;" *J. Mater. Chem.*, 2006; pp. 736-740; vol. 16.

Moynihan et al.; "Alignment and Dynamic Manipulation of Conjugated Polymer Nanowires in Nematic Liquid Crystal Hosts;" *Adv. Mater.*; 2008; pp. 2497-2502; vol. 20.

Wolarz et al.; "Dichroic fluorescent dyes for 'guest-host' liquid crystal displays;" *Displays*; 1992; pp. 171-178; vol. 13, No. 4.

Stolarski et al.; "Fluorescent Perylene Dyes for Liquid Crystal Displays;" *Dyes and Pigments*; 1994; pp. 295-303; vol. 24.

Van Ewyk et al.; "Anisotropic fluorophors for liquid crystal displays;" *Displays*; Oct. 1986; pp. 155-160.

Langhals; "Control of the Interactions in Multichromophores: Novel Concepts. Perylene Bis-imides as Components for Larger Functional Units;" *Helvetica Chimica Acta*; 2005; pp. 1309-1343; vol. 88.

Langhals et al.; "Intense Dyes through Chromophore-Chromophore Interactions: Bi- and Trichromophoric Perylene-3,4:9,10-bis(dicarboximide)s;" *Angew. Chem. Int. Ed.*; 1998; pp. 952-955; vol. 37, No. 7.

International Search Report dated Sep. 19, 2012 from International Application No. PCT/EP2012/062868.

Written Opinion of the International Searching Authority dated Sep. 19, 2012 from International Application No. PCT/EP2012/062868.

* cited by examiner

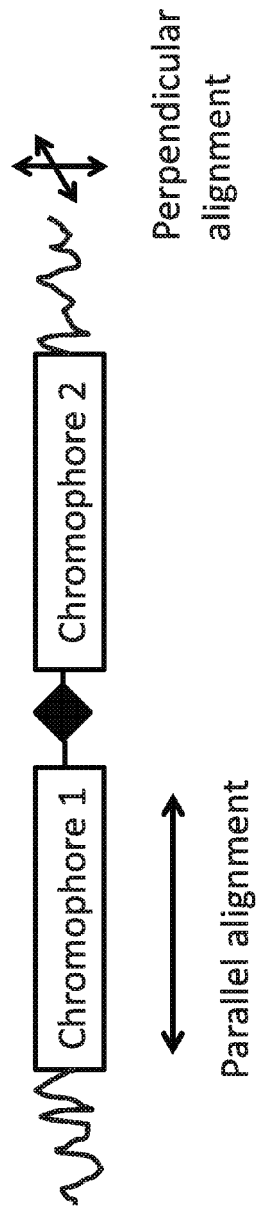

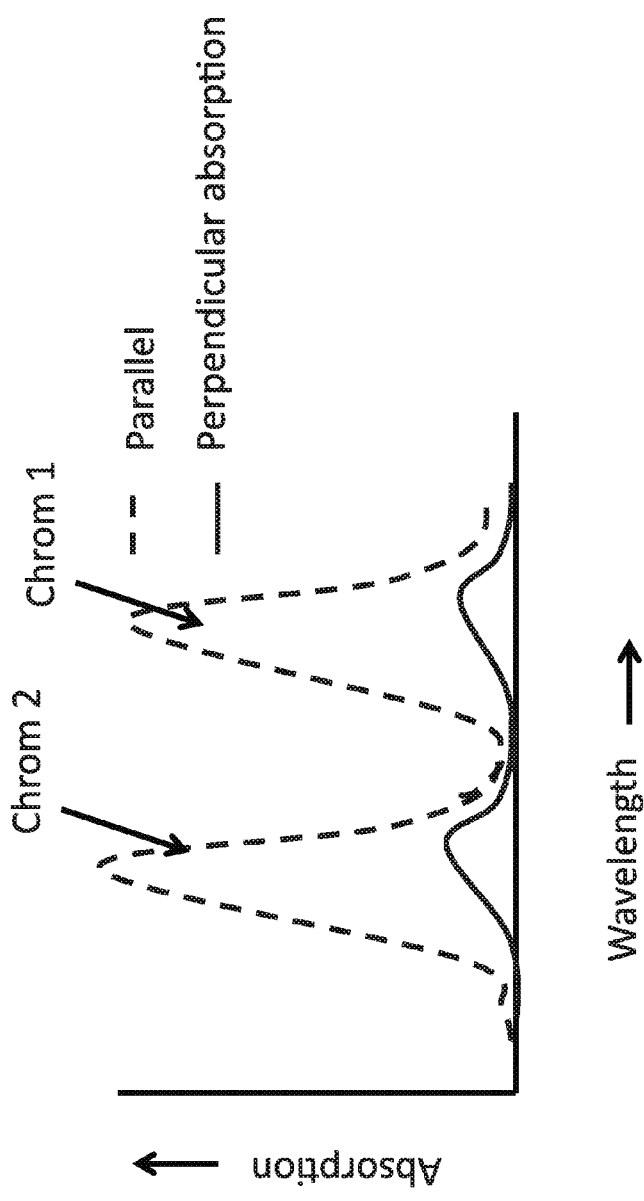
Fig. 1 a) and b): Configuration with the second chromophores being arranged along the primary absorption axis of the first (rylene) chromophore (a) and a possible behavior (b) for light hitting the guest host mixture parallel or perpendicular to its alignment.

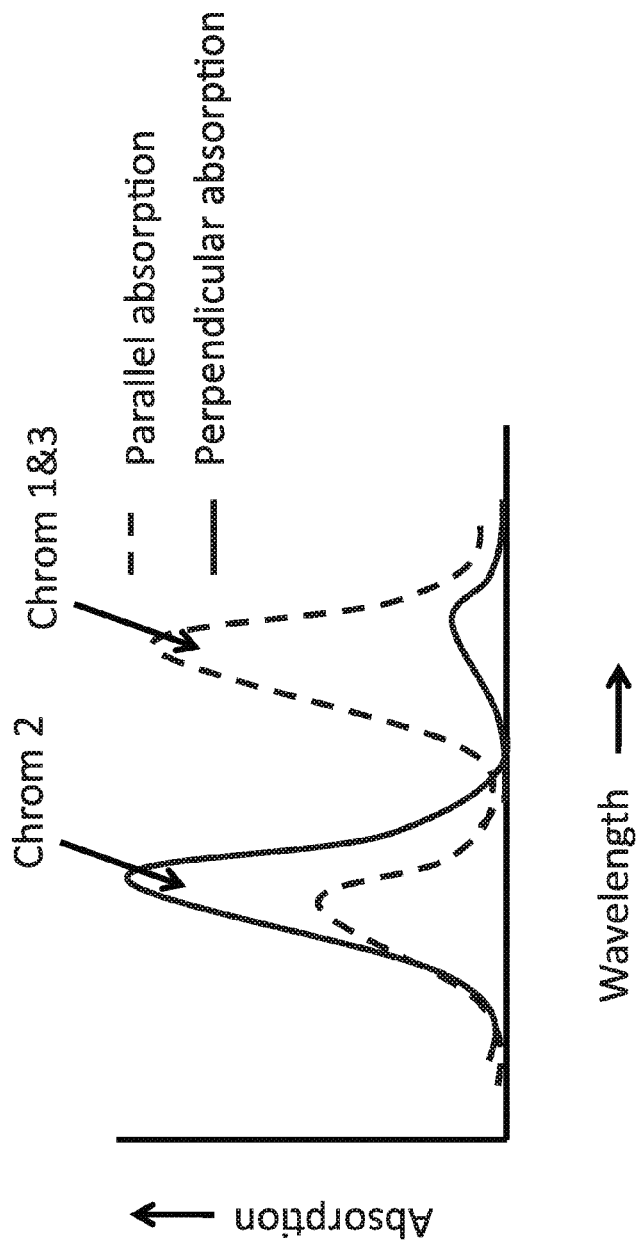
Fig. 2 a) and b): Configuration with one chromophore being arranged with its absorption axis perpendicular to the molecular axis (a) and a possible behavior (b) for light hitting the guest host mixture parallel or perpendicular to its alignment.

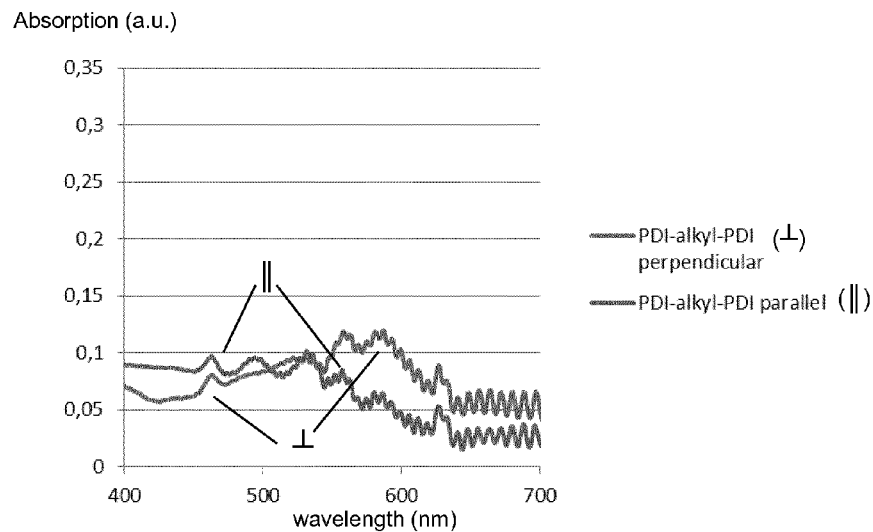
Fig. 3: Absorption spectra of molecule PDI-alkyl-PDI (0.05 wt% in liquid crystal host E7), measured with light polarized parallel and perpendicular to the absorption axis.
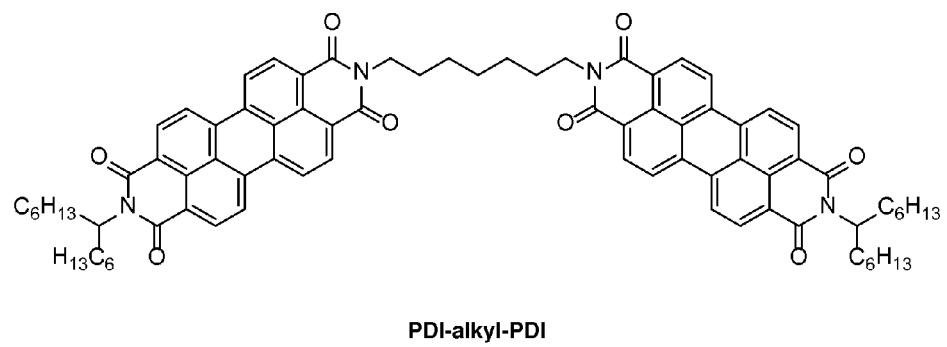
PDI-alkyl-PDI

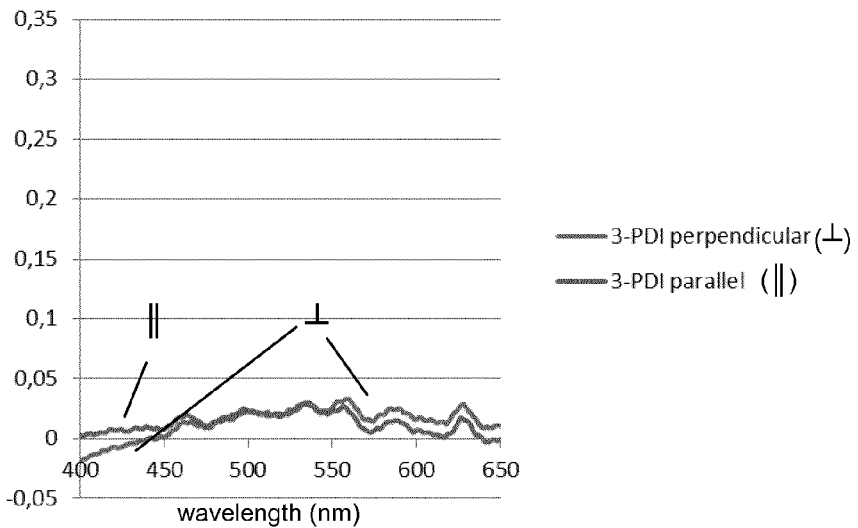
Fig. 4: Absorption spectra of triangle like molecule 3-PDI (0.05 wt% in liquid crystal host E7), measured with light polarized parallel and perpendicular to the absorption axis.
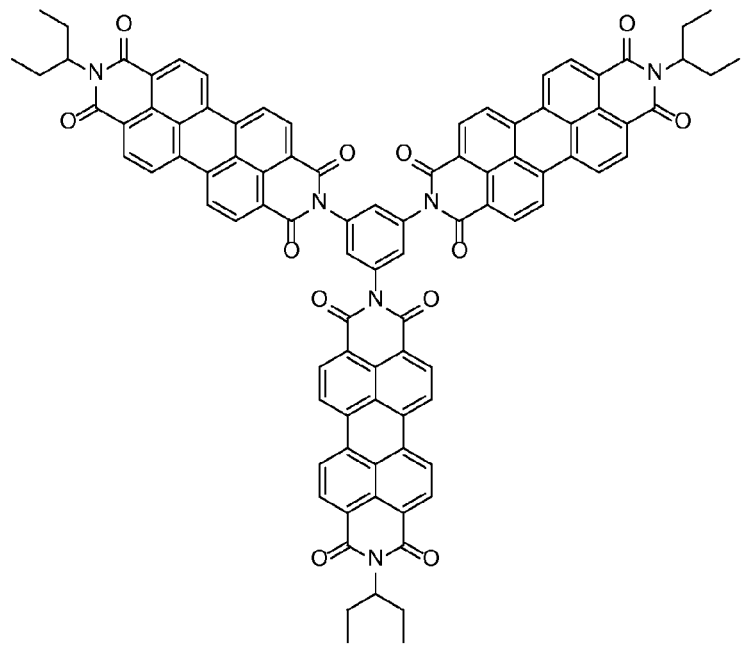
3-PDI

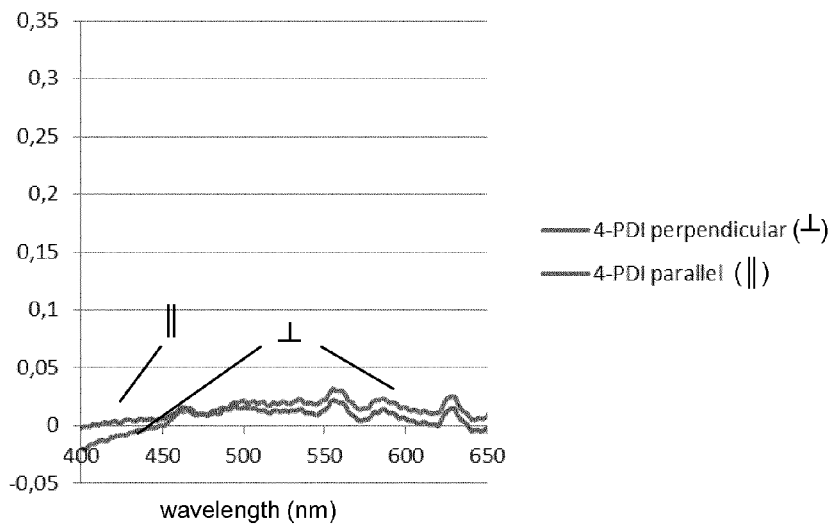
Fig. 5: Absorption spectra of star like molecule 4-PDI (0.05 wt% in liquid crystal host E7), measured with light polarized parallel and perpendicular to the absorption axis.
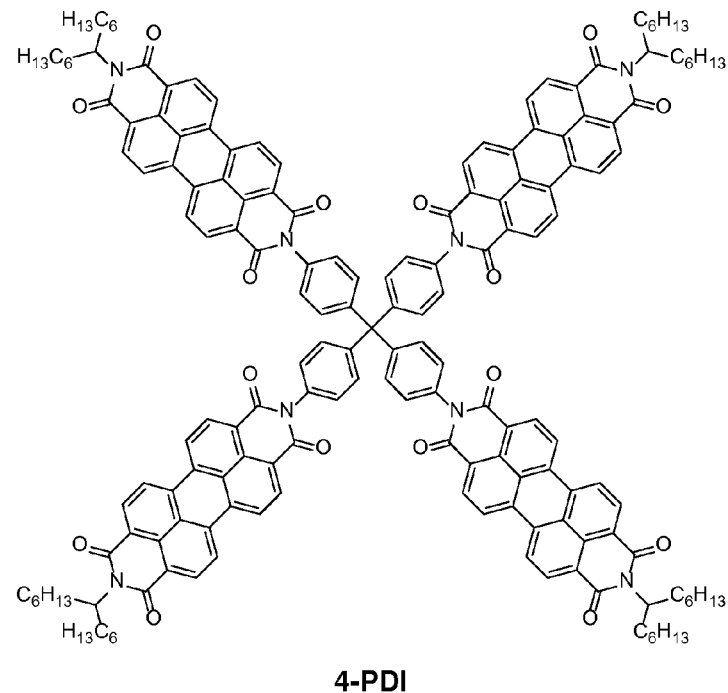
4-PDI

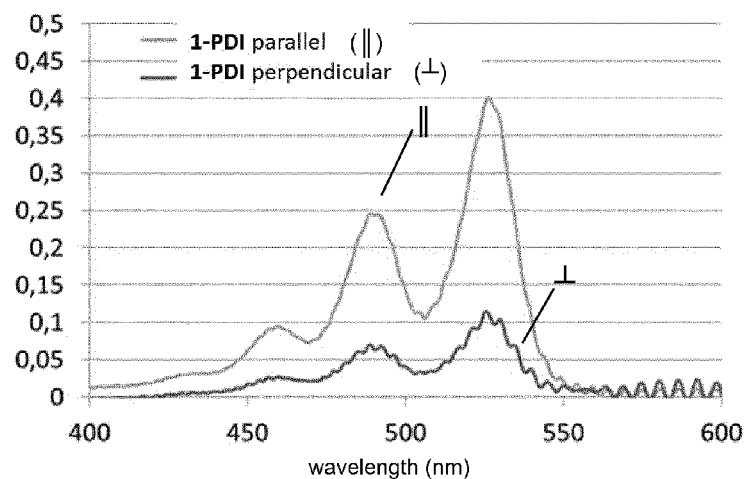
Fig. 6: Absorption spectra of molecule 1-PDI (0.1 wt% in liquid crystal host E7), measured with light polarized parallel and perpendicular to the absorption axis.
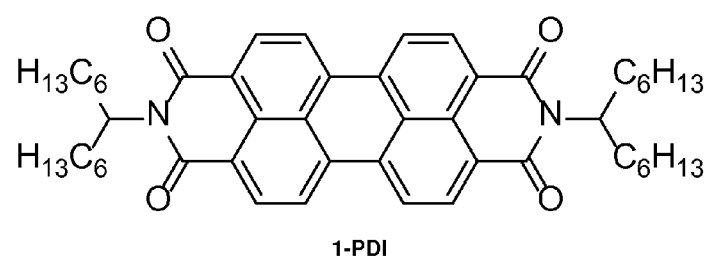
1-PDI

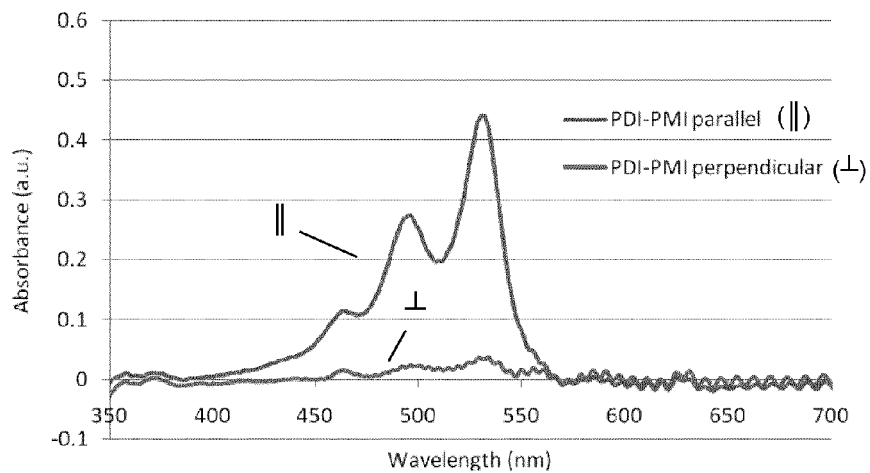
Fig. 7: Absorption spectra of molecule PDI-PMI (0.1 wt% in liquid crystal host E7), measured with light polarized parallel and perpendicular to the absorption axis.
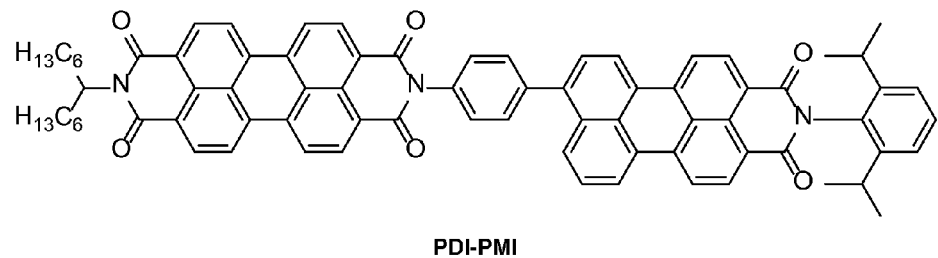
PDI-PMI

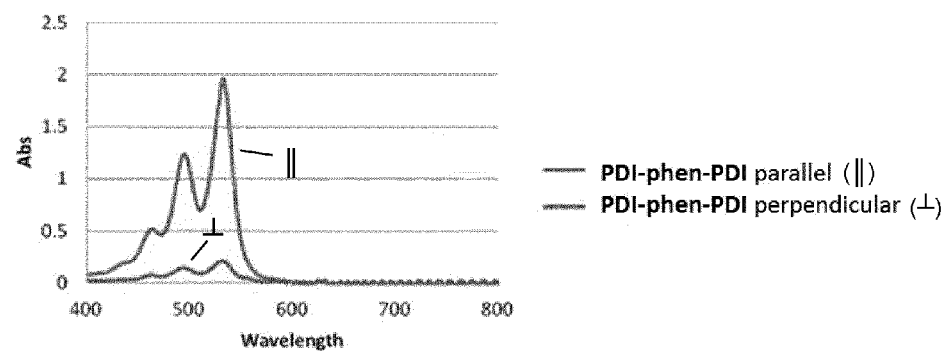
Fig. 8: Absorption spectra of molecule PDI-phen-PDI (0.25 wt% in liquid crystal host E7), measured with light polarized parallel and perpendicular to the absorption axis.
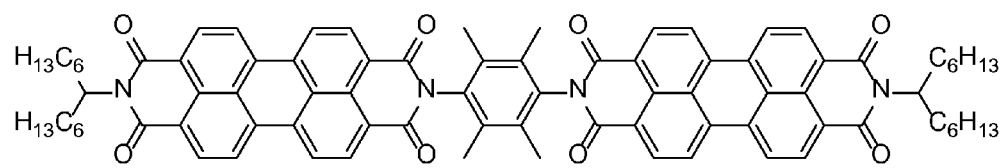
PDI-phen-PDI

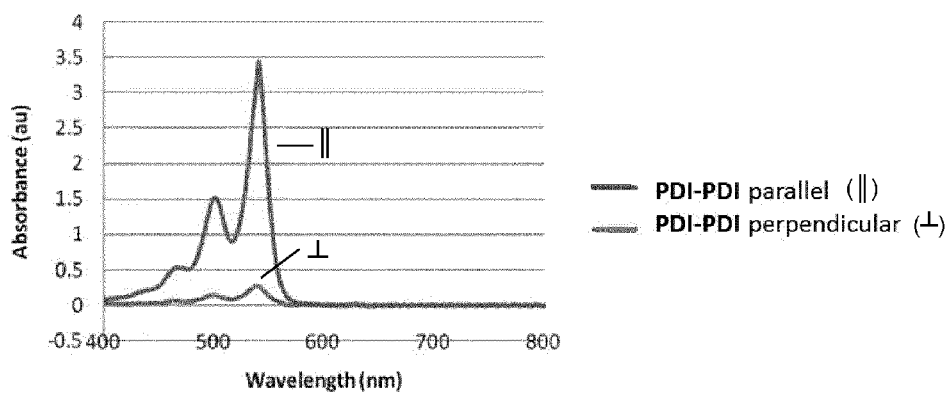
Fig. 9: Absorption spectra of molecule PDI-PDI (0.25 wt% in liquid crystal host E7), measured with light polarized parallel and perpendicular to the absorption axis.
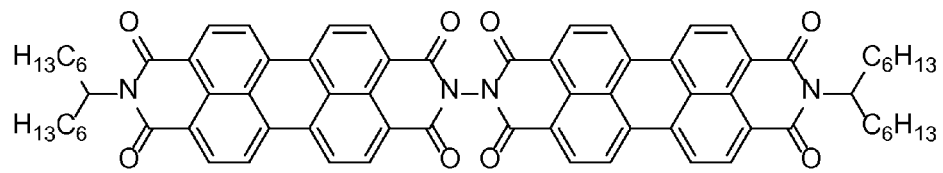
PDI-PDI

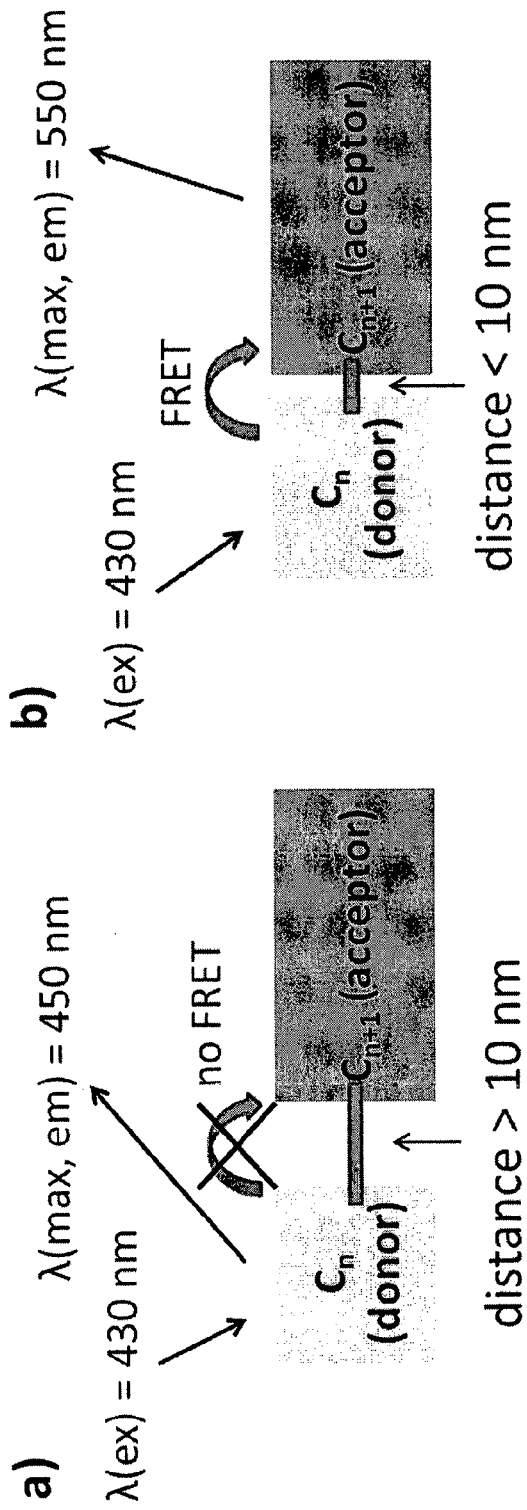

Fig. 10: Schematic demonstration of Förster Resonance Energy Transfer (FRET). In a) and b) a schematic multichromophoric dye with two different chromophores $C_n$ (donor) and $C_{n+1}$ (acceptor) is shown, where $C_n$ is fluorescent and has a peak absorption at shorter wavelengths than $C_{n+1}$, and where the fluorescence emission of $C_n$ overlaps the absorption of $C_{n+1}$. With these specifications FRET occurs when the distance between the donor and acceptor chromophore is less than 10 nm (example b); by exciting the donor $C_n$ the energy is transferred to acceptor $C_{n+1}$ which emits the light at longer wavelengths.

LIQUID CRYSTAL DYE MIXTURE

BACKGROUND

The present invention pertains guest-host liquid crystal mixtures wherein the guest is a dichroic fluorescent dye.

Liquid crystals (LC) are well known to those skilled in the art and can be defined as that class of matter which has an intermediate or mesomorphic state in which these substances behave mechanically as liquids yet exhibit many optical properties of crystals. The mesomorphic state or liquid crystalline phase is obtained either by heating liquid crystals that are in the solid phase or by cooling liquid crystals that are in the liquid phase. Liquid crystal substances may exist in one of the cholesteric, smectic or nematic state. The cholesteric state is distinguished from the nematic state by its markedly different optical properties.

For example, cholesteric materials are optically negative whereas nematic materials are optically positive. Optically positive liquid crystals transmit light more slowly perpendicular to the layers of molecules than parallel to them. Nematic liquid crystals orient a beam of ordinary light into two polarized components whose transverse vibrations are at right angles to each other. However, application of force field, such as an electric field, lines the molecules up, changing their optical properties.

In the past liquid crystal "guest-host" display devices have been developed. The term "host" refers to the liquid crystal material, and the term "guest" refers to an agent which may be aligned by the host to produce contrasting light absorptive states in response to selectively activeable external stimuli. For example, U.S. Pat. No. 3,833,287 to Taylor, et al. discloses a host nematic liquid crystal used in conjunction with a pleochroic guest material which in mixture corresponds to the helical molecular orderings of the nematic liquid crystal material. In the helical ordering the guest material is absorptive of incident light, whereas the guest material is non-absorptive of light when aligned by the nematic crystals under the influence of an applied electric field. Accordingly, when an electric field is applied to a thin layer of the mixture in the display device, incident light passes through the mixture and is reflected off the backing thus exhibiting the color of the backing.

In recent years refinement of effective guest-host systems have been developed using dichroic dyes. Dichroism is the property whereby an oriented assembly of dye molecules exhibits relatively low absorption of a given wavelength of light in one state of orientation and a relatively high absorption of the same wavelength in another state of orientation with respect to the light source. The orientation can be brought about by dissolution of the dye in a liquid crystal solvent or by embedding the dye in a stretched plastic.

Dichroic fluorescent dyes have applications in many fields, for example in displays [Chen and Swager: Org. Lett., Vol. 9, No. 6, 2007], lighting [US 2007/0273265], lasers [JP1994318766] and switchable glazing [WO2009141295]. In order to have a liquid crystalline dye mixture within a useful temperature range, it is common to mix these dichroic dyes with thermotropic liquid crystals. These liquid crystal dye mixtures are known as guest-host LC systems, as the alignment of the dye (the guest) is dictated by the alignment of the liquid crystal (the host).

The purpose of these LC-dye mixtures is to be able to control the absorption or fluorescence emission (or both) of light by the dye. A measure of how well the absorption can be controlled is the dichroic ratio of the dye in the LC mixture. The dichroic ratio is the ratio in absorption for light coming in parallel to the absorption axis of the molecule ($A_\parallel$) versus light traveling perpendicular to the absorption axis ($A_\perp$):
$DR=A_\parallel/A_\perp$. Another way of expressing the same property is the order parameter (S), which is defined as $$S = \frac{(A_\parallel - A_\perp)}{(A_\parallel + 2A_\perp)}.$$

The order parameter is 1 for perfect order and 0 for a perfect isotropic system. A high dichroic ratio or order parameter allows a high contrast in absorption or emission, which is desirable in many applications.

At the same time, it is desirable to have a high solubility of the dichroic dye in the liquid crystal. The higher the solubility of the dyes, the less liquid crystal is required as host material, offering a potential to save material.

As a third requirement, a high light stability of the dye is desirable. A high light stability allows a long lifetime of the devices in high power conditions such as sunlight, lasers or interior lighting.

As a fourth requirement, the fluorescent dichroic dye should have high quantum efficiency. The quantum efficiency is the ratio of emitted photons to absorbed photons of the dye. The higher the quantum efficiency of the dye, the better the dye fluoresces. A good fluorescent dye has a quantum efficiency of at least 0.5, but preferably close to 1.

Many classes of dyes have been proposed which are both fluorescent and dichroic. A general introduction to dichroic dyes can be found for example in Liquid crystals: applications and uses, Volume 3, by Birenda Bahadur (Edt), World Scientific Publishing, 1992.

Fluorescent dichroic anthraquinone dyes have been used in display applications, where light intensities were moderate. For examples, an excellent report on the search for fluorescent dichroic dyes in fluorinated liquid crystals is given by Iwanaga, in *Materials* 2009, 2, 1636-1661; showing dichroic ratios up to 10 with solubility of 1-2 wt % in fluorinated liquid crystal LIXON 5052 XX.

However anthraquinones are limited in their lifetime under high light intensities and have moderate quantum efficiencies.

Good aligning fluorescent dichroic dyes are the Acenequinones type by Chen and Swager: Org. Lett., Vol. 9, No. 6, 2007. Again here the quantum yield is limited (0.30 or lower).

Thiadiazole dyes have been tried, for example by Xuelong Zhang, et al, J. Mater. Chem., 2006, 16, 736-740. There, reasonable (0.5-0.8) quantum efficiencies were found with very good alignment (DR=10-15) for reasonable concentrations (0.5 wt %). The light stability is moderate and does not fulfill the demands for high intensity applications.

Excellent order parameters are achieved when fluorescent dyes self-assemble into wires and are suspended in liquid crystals, see for example Shane Moynihan, Pierre Lovera, Deirdre O'Carroll, Daniela Iacopino, and Gareth Redmond Adv. Mater. 2008, 20, 2497-2502. However, it is difficult to achieve high concentrations while avoiding agglomeration of the aggregates causing quenching of the fluorescence.

The class of rylene type dyes has received particular attention for its excellent fluorescence quantum yield (0.8-1) and its high light stability. Therefore, many people have tried to align these materials in liquid crystal hosts:

U.S. Pat. No. 4,378,302 describes mixtures of perylene bisimide with liquid crystals to form a liquid crystal guest-host mixture.

E WOLARZ, H MORYSON AND D BAUMAN, in Displays, Vol. 13 No 4 1992, pp 171. Shows a maximum order parameter of 0.63 for rylene type dyes.

Perylenes in liquid crystal mixture E7 are shown in Roland Stolarski and Krzysztof J. Fiksinski, *Dyes and Pigments* 24 (1994) 295-303, reporting an order parameter of 0.41 for perylene-3,9(or 10)-dicarboxylic acid derivatives.

Perylene diester fluorophores in the liquid crystal mixture E7 are reported in: Anisotropic fluorophores for liquid crystal displays, R L VAN EWYK, I O'CONNOR, A MOSLEY, A CUDDY, C HILSUM, C BLACKBURN, J GRIFFITHS AND F JONES in DISPLAYS, OCTOBER 1986, pp 155.

Light fast rylene type dyes are commercially sold by BASF under the name Lumogen. Their order parameter in a nematic liquid crystal is low:

TABLE

| Name | Peak absorption (nm) | order parameter in nematic LC | maximum solubility (wt %) |
|---|---|---|---|
| Lumogen F yellow 083 | 480.5 | 0.33 | 0.05 |
| Lumogen F yellow 170 | 511.0 | 0.45 | 0.05 |
| Lumogen F orange 240 | 533.0 | 0.30 | |
| Lumogen F pink 285 | 557.0 | 0.19 | |
| Lumogen F red 300 | 574.5 | −0.09 | |
| Lumogen F red 305 | 577.5 | −0.12 | 0.2 |
| Lumogen F green 850 | 482.5 | 0.30 | |
| Lumogen IR 765 | 712.0 (crystals) | 0.79 (crystals) | 0.08 |
| Lumogen IR 788 | 725.0 (crystals) | 0.30 (crystals) | Insoluble |

As is apparent from the table above, these dyes suffer from a low order parameter. The Lumogen IR 765 and Lumogen IR788 have poor fluorescence and have no significant solubility (<<0.1 wt %) in commercial liquid crystal mixture MLC6653 from (Merck Darmstadt), a nematic liquid crystal mixture with positive dielectric anisotropy and a positive delta n.

SUMMARY

It is thus one objective of the invention to provide a class of dyes that is able to perform well on all four demands at once.

This objective is achieved by a guest-host liquid crystal dye mixture comprising a calamatic, thermotropic liquid crystal as host and a dichroic fluorescent dye as guest, characterized in that the dichroic fluorescent dye is a multichromophoric dye containing at least a group with the general formula Ry-$X_1$-$C_1$, wherein Ry is a chromophore from the rylene family, $C_1$ is a second chromophore and $X_1$ is a spacer that interrupts the conjugation between Ry and $C_1$.

In particular, the multichromophoric dyes have at least one rylene chromophore as part of the dye structure.

BRIEF DESCRIPTION OF THE DRAWINGS

FIG. 1a/b shows the configuration with the second chromophore being arranged along the primary absorption axis of the first (rylene) chromophore (a) and a possible behavior (b) for light hitting the guest host mixture parallel or perpendicular to its alignment.

FIG. 3 shows the absorption spectra of molecule PDI-alkyl-PDI (0.05 wt % in liquid crystal host E7), measured with light polarized parallel and perpendicular to the absorption axis.

FIG. 4 shows the absorption spectra of triangle like molecule 3-PDI (0.05 wt % in liquid crystal host E7), measured with light polarized parallel and perpendicular to the absorption axis.

FIG. 5 shows the absorption spectra of star like molecule 4-PDI (0.05 wt % in liquid crystal host E7), measured with light polarized parallel and perpendicular to the absorption axis.

FIG. 6 shows the absorption spectra of molecule 1-PDI (0.1 wt % in liquid crystal host E7), measured with light polarized parallel and perpendicular to the absorption axis.

FIG. 7 shows the absorption spectra of molecule PDI-PMI (0.1 wt % in liquid crystal host E7), measured with light polarized parallel and perpendicular to the absorption axis.

FIG. 8 shows the absorption spectra of molecule PDI-phen-PDI (0.25 wt % in liquid crystal host E7), measured with light polarized parallel and perpendicular to the absorption axis.

FIG. 9 shows the absorption spectra of molecule PDI-PDI (0.25 wt % in liquid crystal host E7), measured with light polarized parallel and perpendicular to the absorption.

FIG. 10a/b shows schematically the demonstration of Förster Resonance Energy Transfer (FRET). In a) and b) a schematic multichromophoric dye with two different chromophores $C_n$ (donor) and $C_{n+1}$ (acceptor) is shown, where $C_n$ is fluorescent and has a peak absorption at shorter wavelengths than $C_{n+1}$, and where the fluorescence emission of $C_n$ overlaps the absorption of $C_{n+1}$. With these specifications FRET occurs when the distance between the donor and acceptor chromophore is less than 10 nm (example b); by exciting the donor $C_n$ the energy is transferred to acceptor $C_{n+1}$ which emits the light at longer wavelengths.

DETAILED DESCRIPTION

Figure 2A:
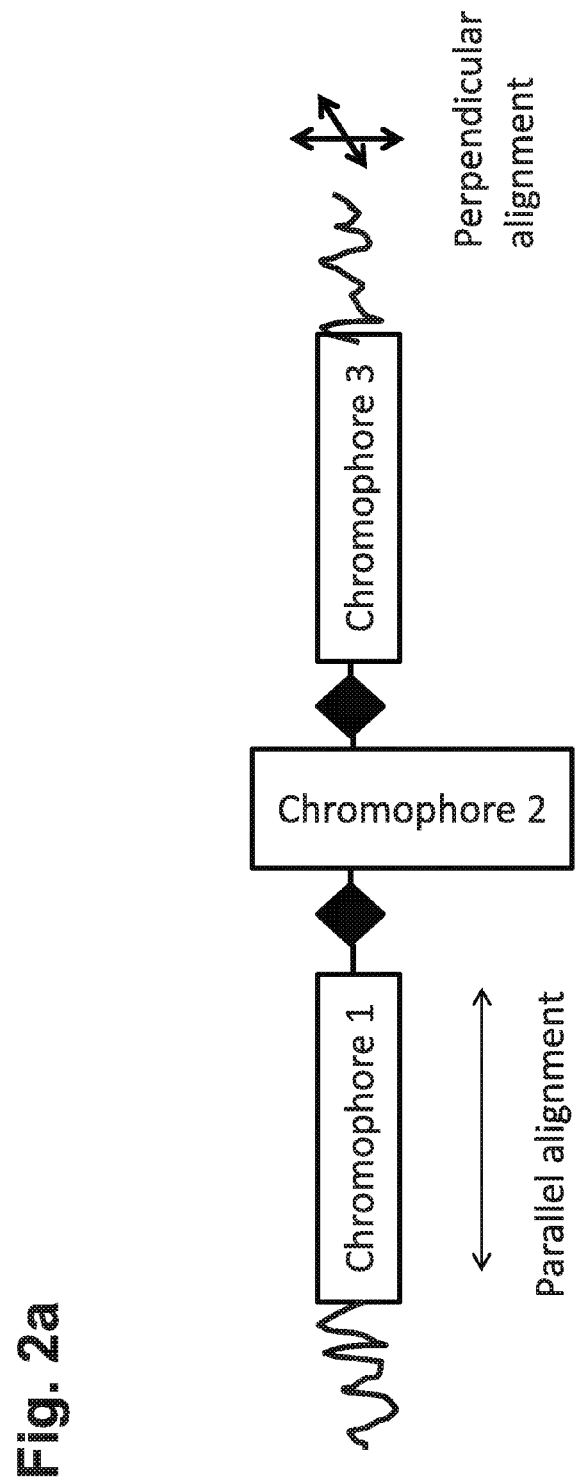
FIG. 2a/b displays a configuration with one chromophore being arranged with its absorption axis perpendicular to the molecular axis (a) and a possible behavior (b) for light hitting the guest host mixture parallel or perpendicular to its alignment.

A chromophore or a chromophoric unit is defined as the part of a molecule that causes its absorption of light in the range 380 nm-800 nm (visible light) and thus causes the color of a molecule. The color arises when a molecule absorbs certain wavelengths of visible light and transmits or reflects others. The chromophoric unit is a conjugated pi ($\pi$) structure. Those skilled in the art know such conjugated $\pi$-structures as systems of connected p-orbitals with delocalized electrons in compounds with alternating single and multiple bonds, which in general may lower the overall energy of the molecule and increase stability. Lone pairs, radicals or carbenium ions may be part of the system. The compound may be cyclic, acyclic, linear or mixed. Conjugation is the overlap of one p-orbital with another across an intervening sigma bond (in larger atoms d-orbitals can be involved).

A conjugated system has a region of overlapping p-orbitals, bridging the interjacent single bonds. They allow a delocalization of pi electrons across all the adjacent aligned p-orbitals. The pi electrons do not belong to a single bond or atom, but rather to a group of atoms.

Due to the involvement of p- and d-orbitals, also metal complexes could be used as chromophores, but they are not practical in terms of solubility.

A multichromophoric molecule—also denoted as multichromophoric dye in the course of this description—is here defined as a molecule that has more than one chromophoric unit, wherein the chromophoric units are separated such that no conjugated pi structure exists between them. In other words, while the individual chromophores or chromophoric units within the multichromophoric molecule possess delocalized pi-structures, the spacers between these chromophoric units are selected such that they do not transfer the delocalization between the various chromophores, but rather interrupt any such conjugation.

Thus, multichromophoric dyes have multiple chromophores that are covalently connected along the length axis of their primary absorption axis and of which at least one of the chromophores is a rylene-type dye. The absorption axis is defined as the axis with the highest absorption for incoming light with polarization parallel to this axis.

The multichromophore according to the invention comprises at least one chromophore from the rylene family.

Rylene dyes are the class of dyes that is formed from naphthalene units that are linked in the ped position. When viewing the chromophore as a polymer, they can be described as poly(peri-naphthalene), for example see the structure below. The rylene radical may be functionalized with at least one imide group, ester group or amide group and may have additional functionalities. Their primary absorption axis is along the length of the molecule (the horizontal axis in the structure below).

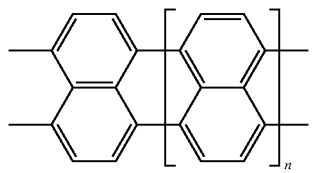

In one embodiment, the additional or secondary chromophore(s) is or are arranged along the primary absorption axis of the rylene dye. In this way, a high dichroic ratio of both the rylene chromophores as well as the secondary chromophores is achieved. FIG. 1 exemplarily shows such configuration and a possible behavior for light hitting the guest host mixture parallel or perpendicular to its alignment. In FIGS. 1 a) and b), Chromophore 1 or Chrom 1 identifies the first (rylene) chromophore while Chromophore 2 or Chrom 2 identifies the second chromophore.

In another embodiment, one rylene type chromophore is arranged with its primary absorption axis along the length of the molecule, whereas another chromophore in the molecule is arranged with its absorption axis perpendicular to the molecular axis. In this case, excellent dichroic ratios can still be achieved for the parallel-attached chromophores, while the absorption of the perpendicular attached chromophore increases when the molecule is rotated with respect to the polarization of the light. The key is that the molecule retains its elongated, cigar like shape.

With such molecule, a large color shift in absorption is achieved by switching the guest-host mixture. FIG. 2 shows an example of such a molecule and the possible behavior. In FIGS. 2 a) and b), Chromophore 1 or Chrom 1 identifies a first chromophore, Chromophore 2 or Chrom 2 identifies a second. chromophore, and. Chromophore 3 or Chrom 3 identifies a third chromophore.

The proposed class of dyes have excellent solubility (>0.2 wt. %) in calamatic (rod-like), thermotropic liquid crystals. Furthermore, they have excellent light-fastness. Their dichroic ratio in liquid crystals exceeds 10 and quantum yield is high (50%-100%).

Because multiple chromophores are incorporated into a single dye, the molar absorption coefficient of these dyes is high. As these multichromophoric dyes have good (>0.2 wt %) solubility in liquid crystals, the specific absorption of the liquid crystal-dye mixture is high, which is beneficial.

One additional benefit of the invention is that it is possible to extend the range between absorbed and emitted wavelengths using FRET (Förster Resonance Energy Transfer). Förster Resonance Energy Transfer is a radiation free transfer of energy between two dipoles that have overlapping absorption and emission spectra. In normal guest-host solutions of using 2 different dye molecules, FRET is not effective because of the large distances between the chromophores (>10 nm). With covalently coupled chromophores, FRET can occur as the chromophores are covalently linked in close proximity of each other. In FIG. 10 a schematic demonstration of a FRET process in such a multichromophoric system is shown. Having FRET occurring is not a requirement for the current invention.

A second benefit is that it is possible that the molecular absorptivity of the multichromophoric units may be higher than the sum of the individual chromophores, see for example Langhals in Helvetica Chimica Acta—vol 88, 2005, pp 1331. A higher molar absorption coefficient makes the guest-host mixture more effective.

Multichromophoric rylene dyes are well known in literature, for example DE 102005037115 list a large number of multichromophoric rylene dyes. A good overview is also given by Langhals in Helvetica Chimica Acta, Vol 88, pp 1309-1343.

However, the multichromophoric dye should be carefully selected in order to meet the requirements in terms of solubility and dichroic ratio.

Preferably, the structure of the multichromophoric dyes should be as follows:

$A_1$-Ry-$X_1$-$C_1$-$X_2$ ... -$C_n$-$A_2$, wherein $A_1$ and $A_2$ are solubilizing aliphatic tails, $X_1$ is a covalent spacer—also called linker—and $C_i$ are chromophores, and Ry is a rylene type dye. For further enhanced solubility, the units $C_1$ and $C_n$ can be different such that an asymmetric molecule is obtained.

$X_i$ is furthermore selected such that it introduces rigidity against bending or folding over an axis perpendicular to the length of the molecule.

The linker or spacer group needs to be carefully chosen. The linker should link the chromophores such that a cigar-like, elongated structure is obtained, providing an arrangement that the absorption axes of the chromophores are in line, and not in a star-shaped or dendritic type of arrangement. Chromophores are meant to be arranged along the same axis if the angle between the absorption axes of the individual chromophores is less than 25 degrees.

The linker group should interrupt the conjugation of the chromophores, which is, e.g., achieved easily by an imide function that is attached to a rylene dye or by a phenylene linker that is twisted out-of-plane in respect to the pi surface of the rylene dye. If the conjugation is not interrupted, the continued conjugation of chromophores implies a 'flat' conformation of the molecule, which is largely detrimental for solubility, and moreover would shift the absorption to the red, probably the IR region, which is not desired, as one of the objectives is an absorption of light in the range of 380 nm-800 nm (visible light).

Furthermore, the linker group should introduce rigidity against bending or folding over an axis perpendicular to the length of the molecule.

Some general examples to provide these requirements are shown:

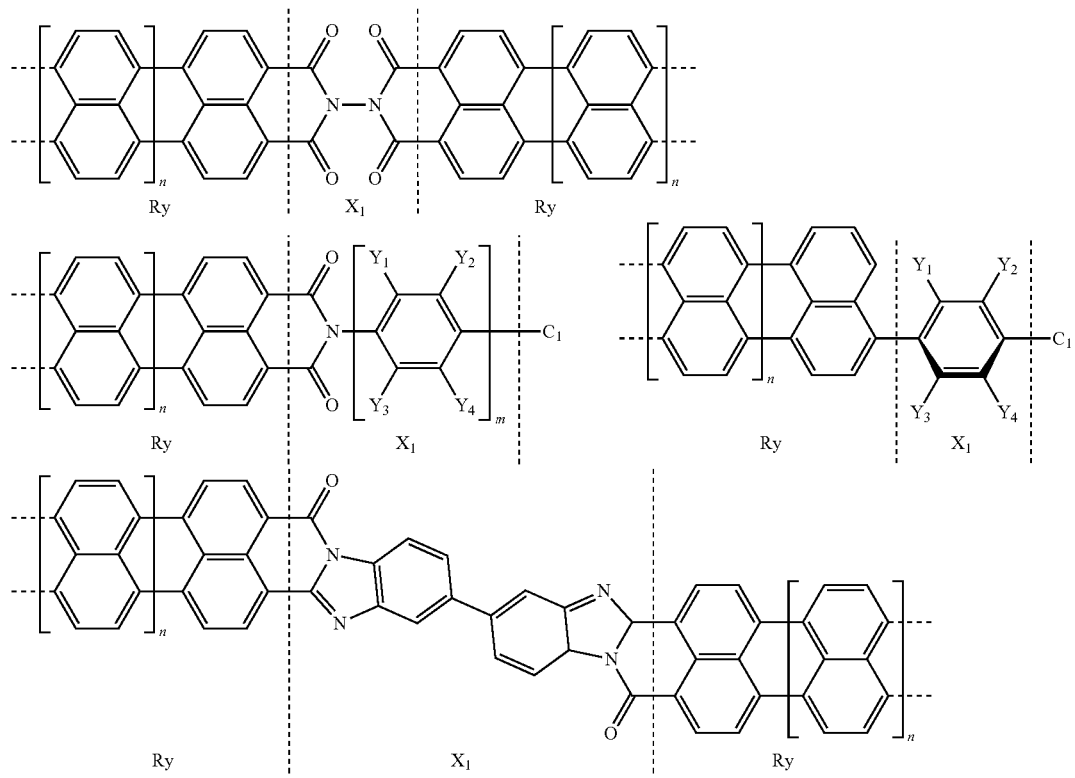

$Y_1$ to $Y_4$ could be H, any branched or non-branched Alkyl- or Alkyloxy-chain, halogen (e.g., fluorine), and so on (n=0, 1, 2, 3; m=1, 2, 3, . . . ).

This would offer a stiff connection, only allowing limited rotation of the chromophores with respect to each other along the length axis of the molecule. A single $C_2H_4$ group as linker would in some cases also work if steric hindrance between the chromophores provides a linear organization; however, any longer aliphatic linkers should be avoided, as they introduce too much flexibility. If this high flexibility is introduced, the improvement in dichroic ratio is lost and a dichroic ratio similar to the single chromophore or worse is obtained.

The invention will be further elucidated by way of the following non-limiting examples:

One suitable bichromophoric dye for the mixtures according to the invention is 2-(4-(2-(2,6-diisopropylphenyl)-1,3-dioxo-2,3-dihydro-1H-benzo[5,10]anthra[2,1,9-def]iso-quinolin-8-yl)phenyl)-9-(tridecan-7-yl)anthra[2,1,9-def:6,5,10-d'e'f']diisoquinoline-1,3,8,10(2H,9H)-tetraone (PBI-PMI) showing 2 chromophoric units arranges along their absorption axis.

This dye shows a good quantum yield of 0.77 in apolar solvents (cyclohexane), with a dichroic ratio of 14 in a liquid crystal host. The dye has two perylene units arranged in line and linked by a benzene type linker. Surprisingly, the solubility of this molecule in fluorinated liquid crystal is high (>0.2 wt %) and the light fastness of the molecule is comparable to the lightfastness of the single perylene bisimide. Therefore this molecule answers all demands for a good fluorescent dichroic dye mixture.

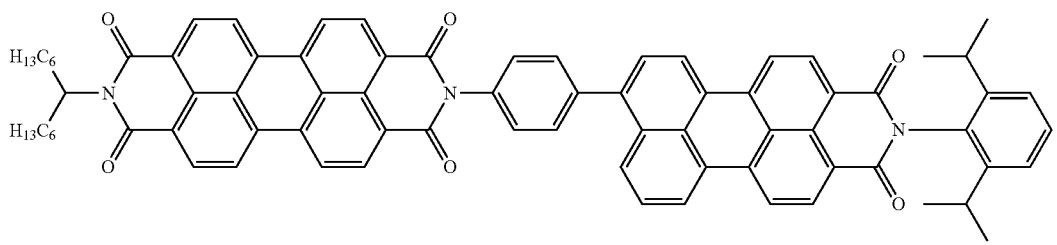

A second example is the molecule perylene bisimide-fluorene derivative 2,7-bis(N-(1-hexylheptyl)-3,4:9,10-perylene-bisimide-N'-yl))-9,9-didodecylfluorene (PFP). This molecule is a derivative of two perylene bisimide chromophores, covalently coupled with a fluorene. Again this molecule shows excellent solubility (0.2 wt %) in fluorinated liquid crystal, good fluorescence, a dichroic ratio of 12 and a good light fastness.

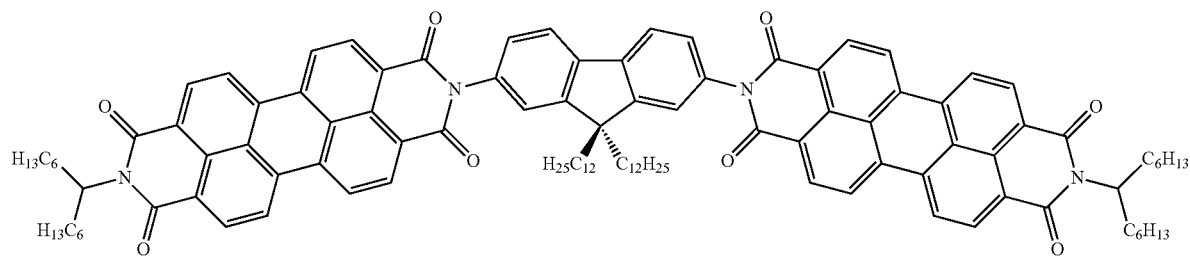

PFP

Combinations of the same chromophore can be used, such as 9,9'-di(tridecan-7-yl)-1H,1'H-[2,2'-bianthra[2,1,9-def:6,5,10-d'e'f']diisoquinolin]-1,1',3,3',8,8',10,10'(9H,9'H)-octaone

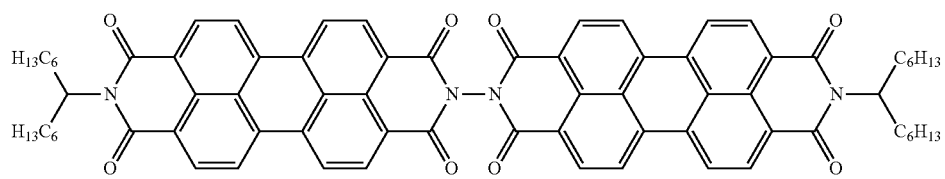

or 9,9'-(1,4-phenylene)bis(2-(tridecan-7-yl)anthra[2,1,9-def: 6,5,10-d'e'f']diisoquinoline-1,3,8,10(2H,9H)-tetraone)

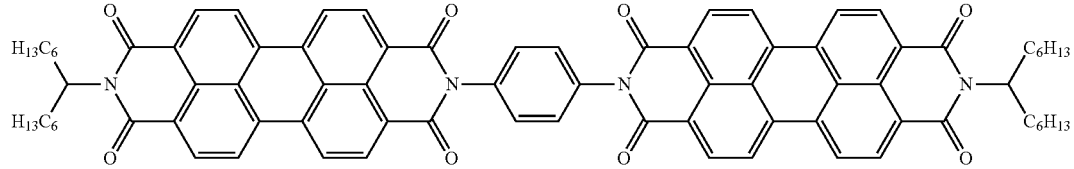

Alternative arrangements are possible, for example 2-{2-(2,6-diisopropylphenyl)-8-phenyl-1H-benzo[5,10]anthra[2,1,9-def]isoquinoline-1,3(2H)-dione}-11-(1-nonyldecyl)benzo[13,14]pentapheno[3,4,5-def:10,9,8-d'e'f']diisoquinoline-1,3,10,12(2H,11H)-tetraone

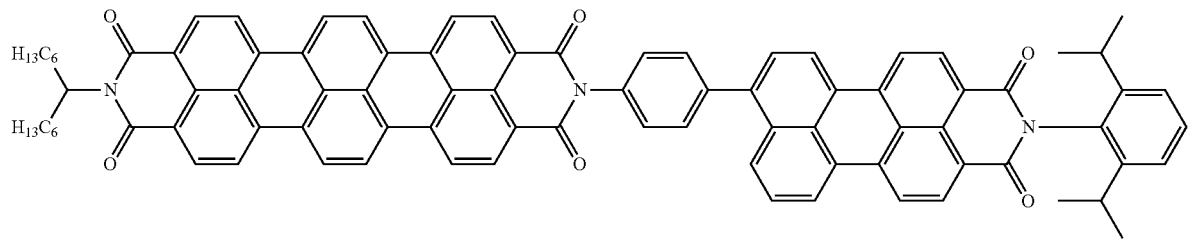

This is a terrylene diimide coupled to a perylene imide. The covalent coupling unit between the chromophores can have different lengths, as long as it meets the criteria outlined before.

In one preferred embodiment of the guest-host liquid crystal dye mixture the chromophores Ry and $C_1$ are identical, i.e., both are the same rylene chromophoric units.

Suitable rylene based multichromophoric dyes are disclosed in the patent application DE-A-102005037115. To arrive at the invention it is, however, necessary to select the linker and the organization of the chromophores in accordance with the requirements outlined hereinabove.

Some other suitable molecules include structure I:
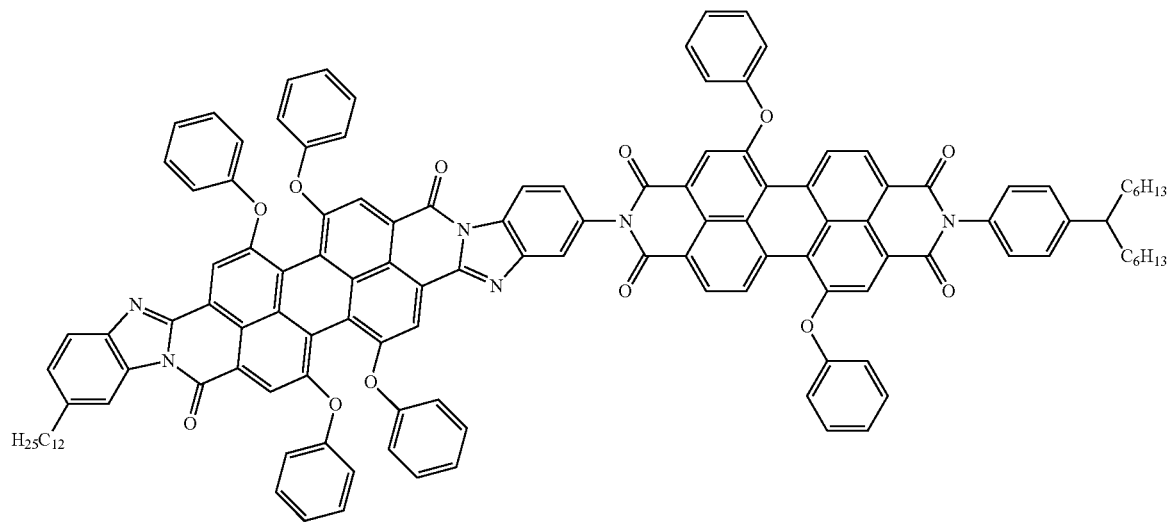
and structure II:
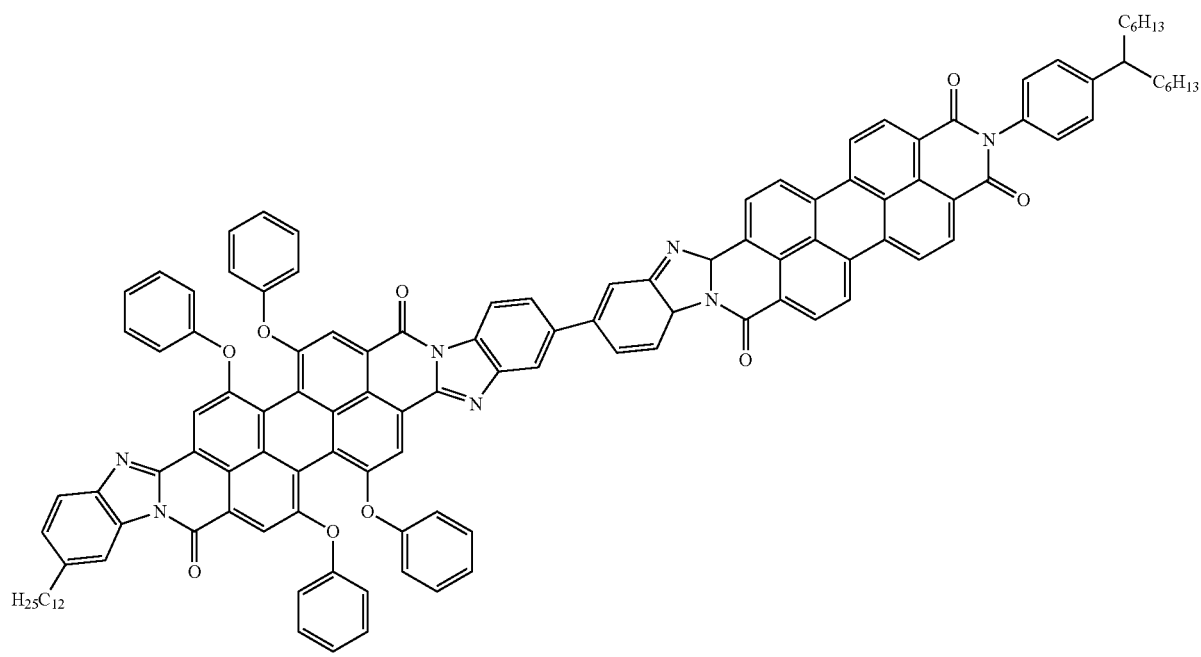
and 2-{4-{2-(1-Hexylheptyl)-9-ylanthra[2,1,9-def;6,5,10-d'e'f']-diisoquinoline-1,3,8,10(2H,9H)-tetraone}-2,3,5,6-tetramethylphenyl}-11-(1-nonyldecyl)benzo[13,14]pentapheno[3,4,5-def:10,9,8-d'e'f']diisoquinoline-1,3,10,12(2H,11H)-tetraone:
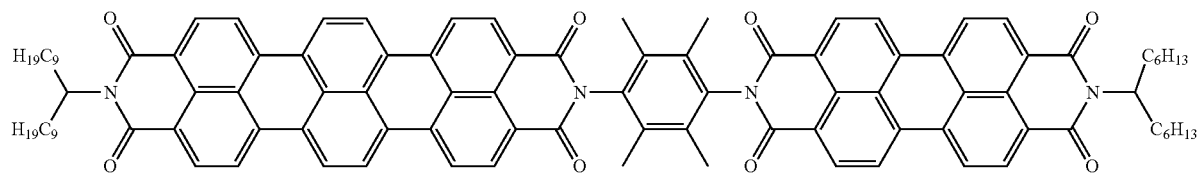

To arrive at the inventive mixtures the dyes designated above are mixed with a liquid crystal to form the guest-host mixture. The liquid crystal mixture according to the invention comprises at least one but preferably a range of liquid crystalline molecules, which LC molecules are thermotropic, calamatic liquid crystals. The mixture is composed in such a way that it has a nematic liquid crystalline phase throughout the desired operating range. The liquid crystal mixture has a positive or a negative dielectric anisotropy.

An example of a suitable mix is the liquid crystal mixture E7, a thermotropic liquid crystal mixture with high birefringence and a positive dielectric and, which consist of the cyaonobiphenyls and cyanotriphenyls in the following composition:

8 wt % 4"-pentyl-[1,1':4',1"-terphenyl]-4-carbonitrile
25 wt % 4'-heptyl-[1,1'-biphenyl]-4-carbonitrile
51 wt % 4'-pentyl-[1,1'-biphenyl]-4-carbonitrile
And 16 wt % of 4'-(octyloxy)-[1,1'-biphenyl]-4-carbonitrile Alternatively, fluorinated LC mixtures with positive dielectric anisotropy can be used. Examples of molecules used in such a mixture are given below and include 4-propyl-4'-(3,4,5-trifluorophenethyl)-1,1'-bi(cyclohexane),

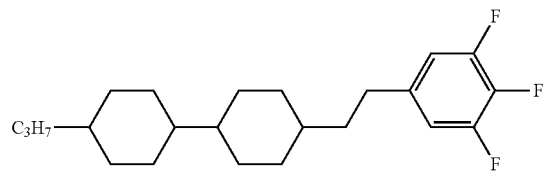

3,4,5-trifluoro-4'-(2-(4-propylcyclohexypethyl)-1,1'-biphenyl

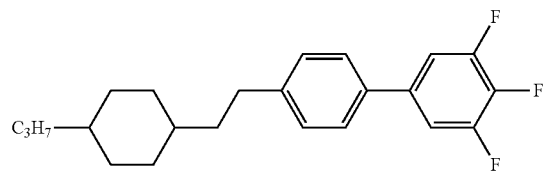

4-(3,4-difluorophenyl)-4'-propyl-1,1'-bi(cyclohexane)

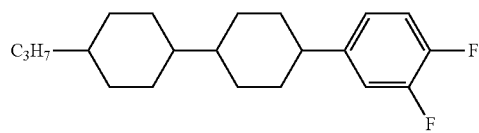

3,4-difluoro-4'-(4-propylcyclohexyl)-1,1'-biphenyl

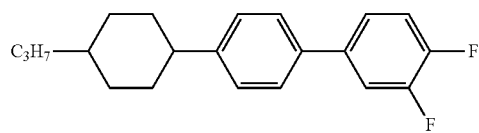

4-propyl-4'-(3,4,5-trifluorophenyl)-1,1'-bi(cyclohexane)

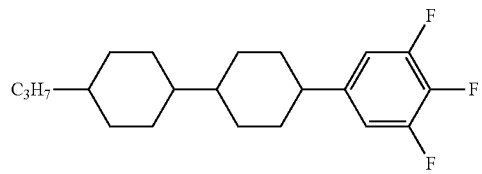

4-(difluoro(3,4,5-trifluorophenoxy)methyl)-4'-propyl-1,1'-bi(cyclohexane)

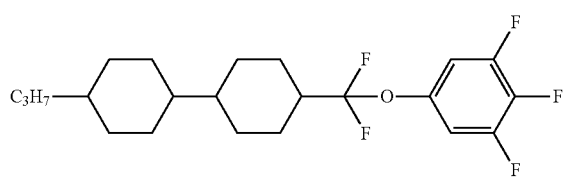

4-propyl-4'-(trifluoromethyl)-1,1'-bi(cyclohexane)

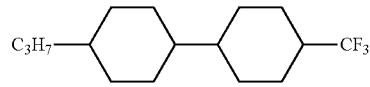

Yet another option is to use liquid crystal mixtures with a negative dielectric anisotropy. The choice for a positive or negative dielectric anisotropy is not specific for this invention.

The inventive guest-host mixture provides
A high (>10) dichroic ratio in absorption
A high solubility (>0.2 wt %) of guests in the liquid crystal and therefore a high absorptivity of the mixture
A high light stability of the dyes
With a good fluorescence quantum yield (>50%)

In the nematic phase, the dyes will be oriented with the liquid crystal. If the orientation of the liquid crystals, and thus the dye, is changed with respect to the incoming light, the absorption is changed. Also, the fluorescence of the dyes is anisotropic. Therefore, the plane in which the fluoresced light is emitted can be controlled using the guest-host mixture.

A large number of methods are known to persons skilled in the art to orient a nematic liquid crystal mixture. These include: surface treatment with polyimide, photoalignment materials, electric fields, magnetic fields.

Dichromophoric rylene type dyes are well known in literature. For example, WO-A-00/52099 reports on the synthesis of a dichromophoric rylene type dye, and many analogues can be found. However reports on bichromophoric dyes in isotropic solvents report a deterioration of solubility compared to the unconnected chromophores, see for example H. Langhals and W. Jona in Angew. Chem. Int. Ed, 1998 37 No 7, pp 952 -955.

Perylenes have also been widely used in combination with liquid crystals as a guest-host type system. Therefore it was surprising to find that the multichromophoric rylene derivatives have a higher solubility in liquid crystal than their monochromophoric counterparts.

The individual rylene based chromophores are known and widely available in literature. There are synthetic routes to multichromophoric units based on rylenes. Liquid crystal guest-host mixtures are well known and it is well known how to mix several liquid crystal molecules to a liquid crystal mixture with the desired properties. However, use of these multichromophoric rylene based moieties in a liquid crystal, showing both the improved solubility and dichroic ratio in a liquid crystal mixture, as compared to the single chromophores, has never been described before.

system. Length control can be achieved by mixing chromophores with mono- and di-functional groups, such that the mono-type chromophores form the end of an aggregate. Also, the non-covalent linking groups should again be rigid groups to achieve the high dichroic ratio.

An example of a suitable assembly is given below. The monofunctional units are 2-methyl-5,6,12,13-tetraphenoxy[3,4,5-tris(octyloxy)benzoate]-9-(4-(tridecan-7-yl)phenyl)anthra[2,1,9-def:6,5,10-d'e'f']diisoquinoline-1,3,8,10(2H,9H)-tetraone, and the bi-functional units are 2,9-dimethyl-5,6,12,13-tetraphenoxy[3,4,5-tris(octyloxy)benzoate]anthra[2,1,9-def:6,5,10-d'e'f']diisoquinoline-1,3,8,10(2H,9H)-tetraone.

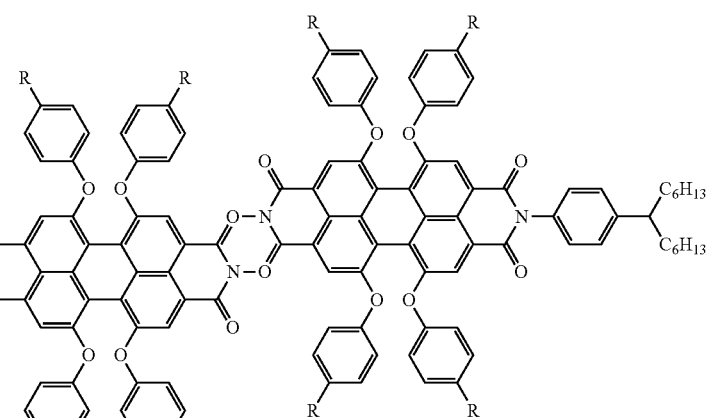

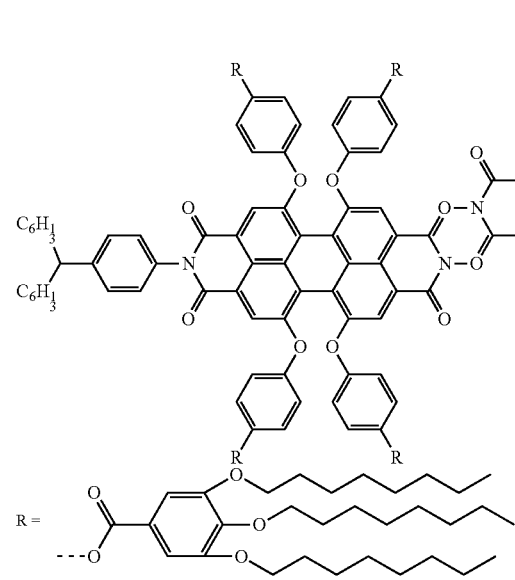

This is due to the problem of the limited solubility of rylene dyes. Normally, one would expect the solubility to decrease with increasing size of the molecule. Surprisingly, this was not found here; to the contrary the solubility improves.

Rylene based dyes have proven to be light fast and highly fluorescent. Therefore they are chosen as a basis for the multichromophoric dyes in liquid crystal. This solution is chosen because it greatly outperforms the monochromophoric dyes in terms of dichroic ratio and solubility.

Similar actions can be performed with different classes of fluorescent dyes. There is a wide range of fluorescent dyes available.

Similar effects can be achieved by aggregates of fluorescent dyes. Many of the rylene-type dyes aggregate due to strong pi-pi interactions. However, only a few aggregates are useful, as the common H-type aggregates have fluorescence quenching. J-type aggregates, where the dyes are aggregating along the length of the chromophore, are suitable for this purpose. Designing molecules that are capable of forming non-covalent bonds such as hydrogen bonds can help the formation of supramolecular assemblies. In this way, the assembly process can be better controlled. Care should be taken to control the length of the aggregates, as very long (>100 nm) aggregates may lead to aggregate clustering in the liquid crystal host, thereby reducing the switchability of the The chemistry of rylene is well known. The rylene derivatives have a proven performance in terms of fluorescence quantum yield and light stability. Supramolecular assemblies are not preferred as they are instable and therefore difficult to control. A negative effect with supramolecular assemblies is that agglomeration (netting) of several assemblies may occur at medium to high concentrations. Agglomeration of assemblies inhibits proper (re)alignment.

The invention is further directed to the use of the guest-host liquid crystal dye mixture in lighting, display, lasing and luminescent solar concentrator applications.

COMPARATIVE EXAMPLES

Starting from a LC-dye mixture using monochromophoric perylene dyes, as for example document U.S. Pat. No. 4,378,302 (Aftergut Siegfried et al), it is not sufficient to simply choose a multichromophoric perylene. To compare the approach here with a LC-dye mixture using multichromophoric perylene dyes, where the linker is chosen differently than described here, comparative examples are given. Experimental procedure: Dyestuff is dissolved in LC host (Merck LC mixture E7) and filled in test cells with a gap of 25 micrometers. The absorption is measured in these test cells with light polarized parallel and perpendicular to the orientation of the LC material.

1. Flexible Spacer

In the patent application DE-A-102005037115, the different chromophores are linked by a -Y'-A-Y- moiety with Y=-O- or -S- (A=aromatic moiety) and therefore contain a flexible linker which is not in accordance with the requirements outlined above. In a given example (FIG. 3) two perylene chromophores are connected by a flexible linker. The graph in FIG. 3 shows the absorption spectra of compound PDI-alkyl-PDI in a LC host, measured with light polarized parallel and perpendicular to the orientation of the LC material. No difference in the intensity of the absorption can be observed for the parallel and perpendicular measurement, which shows that no alignment of the dye with the LC occurs. Furthermore, the compound was very bad soluble (<0.75 wt %).

2. Non-Linear Arrangement

Furthermore in the patent application DE-A-102005037115 the different chromophores in one molecule are not in a linear arrangement, which is due to the flexibility that is introduced by the above mentioned -Y'-A-Y- moiety. In FIGS. 4 and 5 the absorption spectra of two different multichromophoric perylene dyes in a LC mixture are shown. In each case no difference between the spectra measured parallel or perpendicular to the orientation of the LC host is observed, which proves that the absorption axes of the multichromophoric dyes are not in line. Here as well the solubility of the dyes is very poor in LC host E7 (<0.75 wt %).

3. Monochromophoric in LC

The use of monochromophoric perylene dyes like in patent application U.S. Pat. No. 4,378,302 clearly do not fulfill the requirements outlined above. An example is given in FIG. 6. The graph shows the absorption spectra of compound 1-PDI in a LC host. The difference in the absorption between the parallel and perpendicular measured spectrum shows that this monomeric dye does align with the LC host. However, the dichroic ratio was calculated to be about 4, which is not in agreement with the abovementioned requirement (DR>10). This compound was soluble in LC host E7 up to 0.15 wt %.

4. Examples of Multichromophoric Dyes Connected by Linkers that Fulfill the Requirements Outlined Above:

In contrast to the negative examples shown above, the absorption spectra of three different multichromophoric rod-like molecules are shown in FIGS. 7, 8 and 9. All of them exhibit high solubility in LC host E7 (between 0.25 wt % and 1 wt %) and show high dichroic ratios, therefore meeting the requirements outlined above.

The invention claimed is:

1. A guest-host liquid crystal dye mixture comprising a calamatic, thermotropic liquid crystal as host and a dichroic fluorescent dye as guest, wherein the dichroic fluorescent dye is a multichromophoric dye containing at least a group having the general formula Ry-$X_1$-$C_1$, wherein Ry is a first chromophore from the rylene family, $C_1$ is a second chromophore and $X_1$ is a spacer that interrupts the conjugation between Ry and $C_1$, wherein the spacer $X_1$ is selected such that it introduces rigidity against bending or folding over an axis perpendicular to the length of the molecule, and wherein the multichromophoric dye has a linear arrangement.

2. The guest-host liquid crystal dye mixture according to claim 1, wherein the multichromophoric dye has a formula $A_1$-Ry-$X_1$-$C_1$-$X_2$ ... -$C_n$-$A_2$, wherein $A_1$ and $A_2$ each independently represents a solubilizing aliphatic tail, $X_1$, $X_2$ and any additional X each independently represents a covalent spacer that interrupts the conjugation between the Ry and the C, that the particular X is a spacer between, $C_1$, $C_n$ and any additional C each independently represents a chromophore, and each Ry is a chromophore from the rylene family.

3. The guest-host liquid crystal dye mixture according to claim 1, wherein consecutive ones of the second chromophore in the multichromophoric dye comprise a donor chromophore and an acceptor chromophore, wherein
   the donor chromophore and the acceptor chromophore are within a 10 nm distance range from each other;
   the donor chromophore is fluorescent:
   the donor chromophore has a peak absorption at shorter wavelengths than the acceptor chromophore; and
   the fluorescence emission of the donor chromophore overlaps the absorption of the acceptor chromophore, such that Förster Resonance Energy Transfer can occur.

4. The guest-host liquid crystal dye mixture according to claim 1, wherein the primary absorption axis of the chromophores are arranged along the length axis of the guest molecule.

5. The guest-host liquid crystal dye mixture according to claim 1, wherein the primary absorption axis of the chromophore $C_1$ is attached perpendicular with respect to the absorption axis of the chromophore Ry.

6. The guest-host liquid crystal dye mixture according to claim 1, wherein the chromophores Ry and $C_1$ are identical.

7. A lighting device, display, lasing device or luminescent solar concentrator including the guest-host liquid crystal dye mixture according to claim 1.

* * * * *